United States Patent
Usui et al.

(10) Patent No.: US 7,491,895 B2
(45) Date of Patent: Feb. 17, 2009

(54) WIRING SUBSTRATE AND METHOD OF FABRICATING THE SAME

(75) Inventors: Ryosuke Usui, Ichinomiya (JP); Takeshi Nakamura, Isesaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 135 days.

(21) Appl. No.: 11/140,304

(22) Filed: May 26, 2005

(65) Prior Publication Data

US 2005/0266214 A1    Dec. 1, 2005

(30) Foreign Application Priority Data

May 28, 2004    (JP)    ............... 2004-159802

(51) Int. Cl.
H01L 23/48    (2006.01)
(52) U.S. Cl. .............. 174/262; 174/257; 174/264; 174/265; 257/774
(58) Field of Classification Search ........... 174/262, 174/264, 257; 257/774
See application file for complete search history.

(56) References Cited

U.S. PATENT DOCUMENTS

| | | | | |
|---|---|---|---|---|
| 3,146,125 A | * | 8/1964 | Polichette et al. .......... 156/62.2 |
| 3,434,939 A | * | 3/1969 | Brown et al. ............... 205/125 |
| 3,560,257 A | * | 2/1971 | Schneble, Jr. et al. ....... 428/137 |
| 4,054,479 A | * | 10/1977 | Peiffer ..................... 156/280 |
| 4,581,301 A | * | 4/1986 | Michaelson ................ 428/551 |
| 4,642,161 A | * | 2/1987 | Akahoshi et al. ............. 216/35 |
| 4,696,861 A | * | 9/1987 | Tatematsu et al. ........... 428/328 |
| 5,252,195 A | * | 10/1993 | Kobayashi et al. .......... 205/126 |
| 5,340,947 A | * | 8/1994 | Credle et al. ............... 174/262 |
| 6,188,027 B1 | * | 2/2001 | Miller et al. ............... 174/262 |
| 2002/0185721 A1 | | 12/2002 | Hwang et al. |

FOREIGN PATENT DOCUMENTS

| JP | 2002-110717 | 4/2002 |
|---|---|---|
| JP | 2003-249498 | 9/2003 |

* cited by examiner

*Primary Examiner*—Cathy Lam
(74) *Attorney, Agent, or Firm*—Fish & Richardson P.C.

(57) ABSTRACT

A wiring substrate is provided with an insulating resin film; and first and second conductive films provided on the back side and top side of the insulating resin film, respectively. The wiring substrate includes a via formed to fill a recess provided in the insulating resin film and electrically connecting the top side and back side of the insulating resin film. The via includes a first metal film formed to cover the side wall of the recess, an oxide film formed to cover the first meal film, and a second metal film formed on the metal oxide film.

13 Claims, 5 Drawing Sheets

FIG.6

| MEASUREMENT POINTS | W/ METAL OXIDE FILM | W/O METAL OXIDE FILM |
|---|---|---|
| 1 | 1.0 | 1.0 |
| 2 | 1.1 | 1.0 |
| 3 | 1.1 | 1.1 |
| 4 | 1.1 | 1.1 |
| 5 | 1.2 | 1.0 |
| AVERAGE VALUE (kN/m) | 1.10 | 1.04 |
| STANDARD DEVIATION | 0.070710678 | 0.054772256 |

WIRING SUBSTRATE AND METHOD OF FABRICATING THE SAME

BACKGROUND OF THE INVENTION

1. Field of the Invention

The present invention relates to a wiring substrate and a method of fabricating the same.

2. Description of the Related Art

With portable electronic appliances such as mobile phones, PDAs, DVCs and DSCs becoming more and more advanced in their capabilities, miniaturization and weight reduction of products have become essential for market acceptance. Accordingly, highly-integrated system LSIs for achieving these goals are demanded. Also, better ease and convenience of use are required of these electronic appliances. In this respect, high capabilities and high performance are required of LSIs used in these appliances. While the number of I/Os is increasing as a result of increasingly high integration of LSI chips, there is also a persistent requirement for miniaturization of packages themselves. In order to meet these incompatible demands, development of a semiconductor package adapted for high-density substrate mounting of semiconductor components is in serious demand. A packaging technology called chip size packaging (CSP) has been developed in a variety of forms to address these requirements. For example, the patent document No. 1 discloses a CSP technology.

In such a semiconductor package, vias are provided in an insulating resin film for electric connection with circuit elements. In the related art, a via is formed by first forming a via hole in an insulating resin film, forming a thin film in the via hole by electroless plating or the like, and subsequently filling the via hole by electroplating.

Recently, with an increase in the operating speed of electronic appliances, copper has come to be used as a material for forming a via or wiring. One problem with forming a copper via in two stages as described above is that adhesion between the film formed by electroless plating and the film formed by electroplating is poor. Another problem is that stress migration or electromigration occurs at an interface between the films, making the wiring less reliable.

Relate Art List
Patent Document No. 1
Japanese Patent Application Laid-Open No. 2003-249498
Patent Document No. 2
Japanese Patent Application Laid-Open No. 2002-110717

SUMMARY OF THE INVENTION

The present invention has been done in view of the aforementioned circumstances and its object is to provide a technique for improving the reliability of a wiring substrate in which a metal material is formed.

The present invention provides a wiring substrate comprising: a substrate; and a metal film which constitutes wiring formed by filling a recess provided in the substrate, wherein the metal film comprises a first metal film formed to cover the side wall of the recess, an metal oxide film formed to cover the first metal film and a second metal film provided on the metal oxide film.

The term "wiring" inclusively refers to wiring extending parallel with the surface of the substrate and through-hole wiring (through-hole plug) embedded in a via hole or a contact hole. The thickness of the metal oxide film may be 10 nm or less and, more preferably, 1 nm or less. With this, electric connection of the metal films is properly maintained. The thickness of the metal oxide film may be 0.1 nm or greater. By providing the metal oxide film between the first metal film and the second metal film, proper adhesion between the films is ensured. By providing the metal oxide film, the stress migration tolerance and electromigration tolerance of the metal films are improved.

In the inventive wiring substrate, the first metal film and the second metal film may be formed of copper. In the inventive wiring substrate, the metal oxide film may be formed by oxidizing the first metal film. In the inventive wiring substrate, the substrate may be an insulating resin film. The substrate may be an interposer for mounting elements.

The present invention also provides a method of fabricating a wiring substrate comprising the steps of: forming a recess in a substrate; forming a first metal film so as to cover the side wall of the recess; forming a metal oxide film on the first metal film by oxidizing the surface of the first metal film; and forming a second metal film on the metal oxide film. Wiring may be formed by the first metal film, the metal oxide film and the second metal film.

In the inventive method of fabricating a wiring substrate, the first metal film and the second metal film may be formed of copper.

Arbitration combinations of the elements of the present invention are also within the scope of the present invention. Implementations of the present invention in other categories are also within the scope of the present invention.

BRIEF DESCRIPTION OF THE DRAWINGS

FIG. 6 is a chart illustrating results of measuring peel strength in the example.

DETAILED DESCRIPTION OF THE INVENTION

Figure 1A:
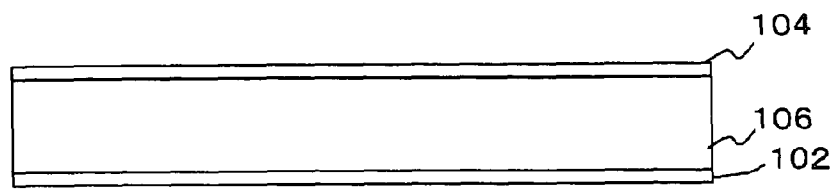
FIGS. 1A through 1F are sections illustrating the steps of fabricating a wiring substrate according to an embodiment of the present invention.

FIGS. 1A through 1F are sections illustrating the steps of fabricating a wiring substrate according to an embodiment of the present invention. As illustrated in FIG. 1A, a sheet, in which a first conductive film 102 and a second conductive film 104 are formed on an insulating resin film 106, is prepared. Subsequently, a resist for forming an opening for a via hole is applied on the second conductive film 104. Portions of the second conducting film 104 are selectively removed by wet etching, using the resist as a mask. With this, selected portions of the second conductive film 104, where the via hole is formed, are removed. The second conductive film 104 may be selectively removed by a laser direct write process (trepanning alignment).

Figure 1B:
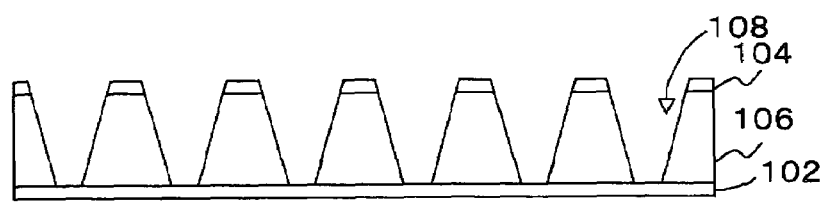

Subsequently, a via hole 108 is formed in the insulating resin film 106, using the second conductive film 104 as a mask (FIG. 1B). The via hole may be formed by an appropriate combination of $CO_2$ gas laser, YAG laser, dry etching and reverse sputtering. In forming the via hole 108 by laser, the first conductive film 102 serves as a stopper layer.

The $CO_2$ gas laser is emitted in a first condition and then in a second condition in which the pulse width is modified. A laser with a pulse period of 0.25 ms and an output of 1.0 W is used. The first condition may be such that the pulse width is 8-10 μs and the number of shots is 1. The second condition may be such that the pulse width is 3-5 μs, the pulse interval is 25 ms or longer and the number of shots is 3. By radiation, the via hole 108 having a tapered side wall with a progressively smaller diameter toward the first conductive film 102 and away from the conductive film 104 is formed.

Figure 2:
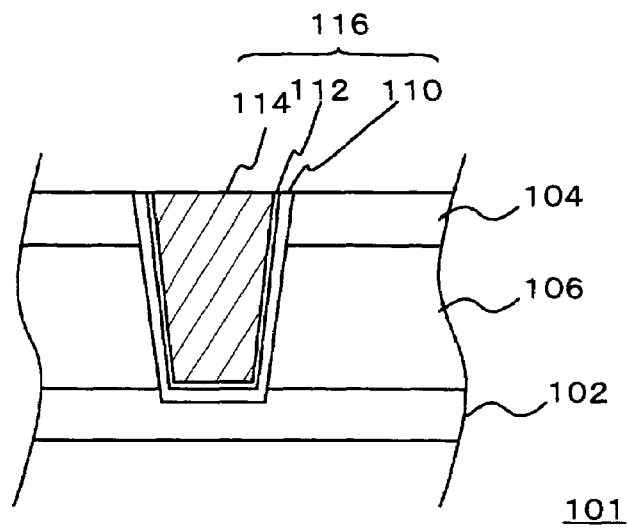
FIG. 2 is a section illustrating the detailed structure of a via fabricated according to the steps illustrated in FIGS. 1A through 1F.

YAG laser and dry etching using a halogen gas such as chlorine and fluorine are employed for further fine processing. As a consequence of this, a portion of the surface of the underlying first conductive film 102 is removed so that a recess is formed in the first conductive film 102 (FIG. 2).

Figure 1C:
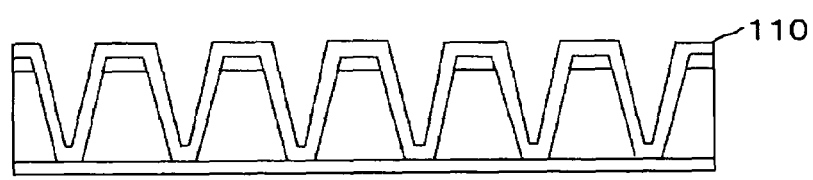

Subsequently, the interior of the via hole 108 is roughened and cleaned by a wet process. Subsequently, a first metal film 110 (about 0.5-1.0 μm) is formed by electroless plating (FIG. 1C). Normally, palladium is used as a catalyst for electroless plating. In order to attach a catalyst for electroless plating to a flexible insulating resin film, palladium is contained in a water solution in the form of complex, the flexible insulating substrate is steeped in the solution so as to attach the palladium complex on the surface thereof, and the palladium complex is reduced to palladium as a metal using a reducing agent. In this way, a core for plating is formed. The first metal film 110 may be formed by sputtering or CVD. The sputtering condition for forming the first metal film 110 may be such that the flow rate of Ar gas is 50 sccm, the pressure is 5 mTorr, the AC power is 150 W, the DC power is 24 kW and the temperature is −40° C.

Figure 1D:
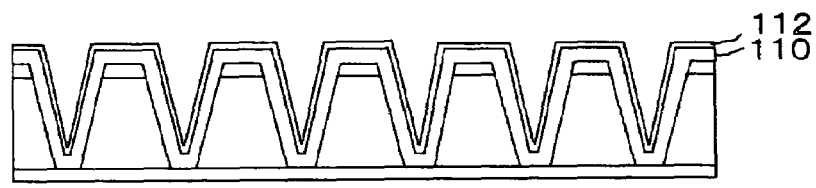
Figure 1E:
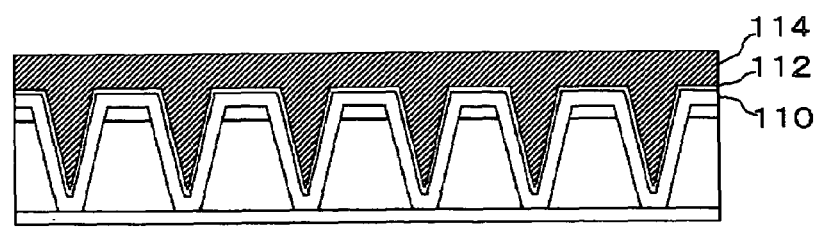

The surface of the first metal film 110 is sprayed with air (air or oxygen gas) at a high pressure (about 500 kPa) so as to form a metal oxide film 112 (about 0.1-1.0 nm) (FIG. 1D). Subsequently, a second metal film 114 (about 20 μm) is formed on the metal oxide film 112 by electroplating so as to fill the via hole 108 (FIG. 1E). According to this embodiment, the first metal film 110 and the second metal film 114 may be formed of copper. The metal film 112 may be formed of cuprous oxide. The second metal film 114 may be by formed of copper such that the second conductive film 104 is immersed in a copper sulphate solution at room temperature and subsequent electroplating.

Figure 1F:
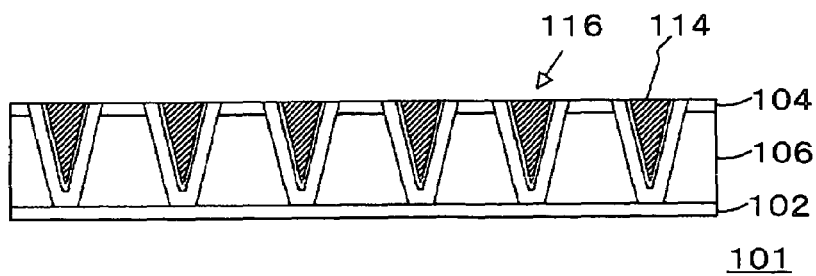

Subsequently, wiring is formed by patterning the second conductive film 104 and the first conductive film 102 to have a predetermined configuration. With this, the wiring substrate 101 is obtained (FIG. 1F). Wiring is formed by, for example, removing unnecessary portions of the conductive film by spraying a chemical etchant where the film is free of the resist and is exposed, using a photoresist as a mask in etching. An etching resist material used in an ordinary printed circuit board may be used as an etching resist. In this case, the wiring may be formed by silk screen printing using a resist ink. Alternatively, a laminate of a photosensitive dry film as an etching resist may be formed on the conductive film, a photomask transmitting light in the shape of a conductive layout may be placed on the laminate. The laminate may be exposed to ultraviolet light, and those portions not exposed may be removed by a developing solution. When a copper foil is used as the first conductive film 102 or the second conductive film 104, a chemical etchant used in an ordinary printed circuit board may be used. For example, a solution of cupric chloride and hydrochloric acid, a ferric chloride solution, a solution of sulfuric acid and hydrogen peroxide or an ammonium persulfate solution may be used.

Subsequently, by building a stack of the insulating resin film 106, provided with the first conductive film 102 and the second conductive film 104 on the respective sides thereof, and repeating similar processes, a multilayer wiring structure is obtained.

FIG. 2 is a section illustrating the detailed structure of a via (through hole wiring) 116 fabricated according to these steps. Since the metal oxide film 112 is formed between the first metal film 110 and the second metal film 114, proper adhesion between the first metal film 110 and the second metal film 114 is ensured. In a structure in which the via 116 is formed of copper, provision of the metal oxide film 112 in the via 116 improves the stress migration tolerance and electromigration tolerance of the via 116.

Further, as a result of a recess being formed in the first conductive film 102 in the process of forming the via hole 108, as described with reference to FIG. 1B, the bottom of the via 116 is surrounded by the first conductive film 102, thereby increasing the area of contact between the via hole 116 and the first conductive film 102. Accordingly, low resistance of these conductive materials is achieved.

Figure 3:
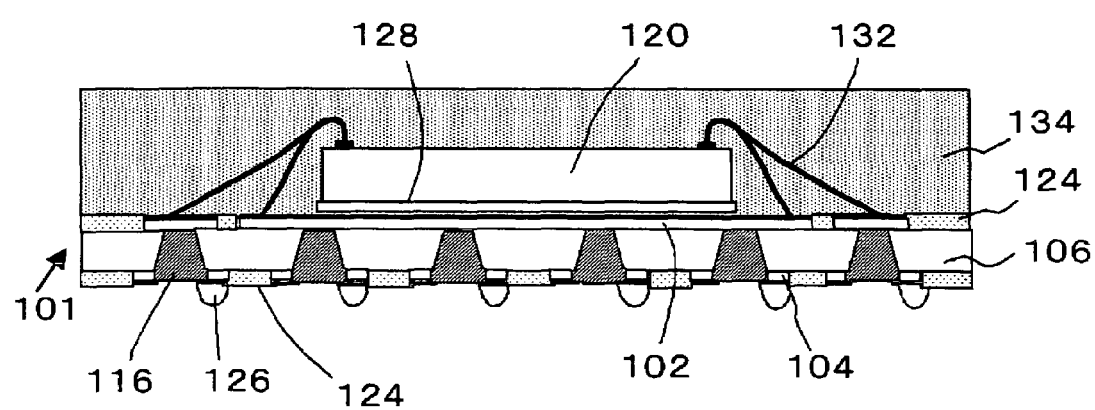
FIG. 3 is a section illustrating a semiconductor apparatus that includes the wiring substrate fabricated according to the steps illustrated in FIGS. 1A through 1F.

The wiring substrate as described above can be used in a semiconductor apparatus 100 as illustrated in FIG. 3. The semiconductor apparatus 100 comprises the wiring substrate 101, a circuit element 120 thereon, a sealing resin 134 sealing the circuit element 120, a bonding wire 132 electrically connecting the circuit element 120 and the first conductive film 102, and a bump 126 electrically connected to the via 116. The circuit element 120 is fixed on the first conductive film 102 by a conductive paste 128 formed of, for example, silver. A photo solder resist 124 is embedded between patterns of wiring formed in the first conductive film 102 and the second conductive film 104. The circuit element 120 is a semiconductor element such as a transistor, diode and IC chip, or a passive element such as a chip capacitor and chip resistor. The circuit element 120 may be a stack of a plurality of elements. In this case, combinations of the plurality of elements include a combination of SRAM and Flash memory, a combination of SRAM and PRAM etc.

Materials for forming the semiconductor substrate for the semiconductor apparatus 100 may be as described below. The first conductive film 102 and the second conductive film 104 may be formed of a rolled metal such as a rolled copper foil.

Any material may be used to form the insulating resin film 106 as long as it is softened by heating. For example, epoxy resin, melamine derivatives such as BT resin, liquid crystal polymer, PPE resin, polyimide resin, fluororesin, phenol resin, polyamide bismaleimide may be used. By using a material as listed, the rigidity of the wiring substrate is improved. By using a thermosetting resin such as epoxy resin, BT resin, PPE resin, polyimide resin, fluororesin, phenol resin, polyamide bismaleimide to form the insulating resin film 106, the rigidity of the wiring substrate is further improved.

Epoxy resin may be bisphenol A type resin, bisphenol F type resin, bisphenol S type resin, phenol novolac resin, creosol novolak type epoxy resin, tris-phenol methane type epoxy resin, alicycle epoxy resin, and the like.

Melamine derivative may be melamine, melamine cyanurate, methylol melamine, (iso) cyanuric acid, melam, melem, succino guamine, melamine sulfate, acetoguanamine sulfate, melam sulfate, guanyl melamine sulfate, melamine resin, BT resin, cyanuric acid, iso-cyanuric acid, iso-cyanuric acid derivatives, melamine isocyanurate, benzoguanamine, acetoguanamine, or guanidine compounds.

Aromatic system liquid crystalline polyester, polyimide, polyesteramide and resin composites containing these are examples of liquid crystal polymer. Liquid crystalline polyester or liquid crystalline polyester composite, characterized by excellent balance in heat resistance, workability and moisture absorption, is preferable.

The insulating resin film 106 may include a filler or an additive such as fiber. Fibrous or granular $SiO_2$ or $SiN$ may be used as the filler. By including a filler or fiber in the insulating resin film 106, it is possible to reduce warp of the insulating resin film 106. By including fiber in the insulating resin film 106, the fluidity of the insulating resin film 106 is improved. In this respect, aramid nonwoven fabric is preferably used as a material to form the insulating resin film 106. With this, workability is improved.

Para-aramid fiber or meta-aramid fiber may be used as aramid fiber. For example, poly (p-phenylene terephthalamide) (PPD-T) may be used to form the para-aramid fiber, and poly (m-phenylene isophthalamide) (MPD-I) may be used as meta-aramid.

EXAMPLE

Example 1

Figure 4:
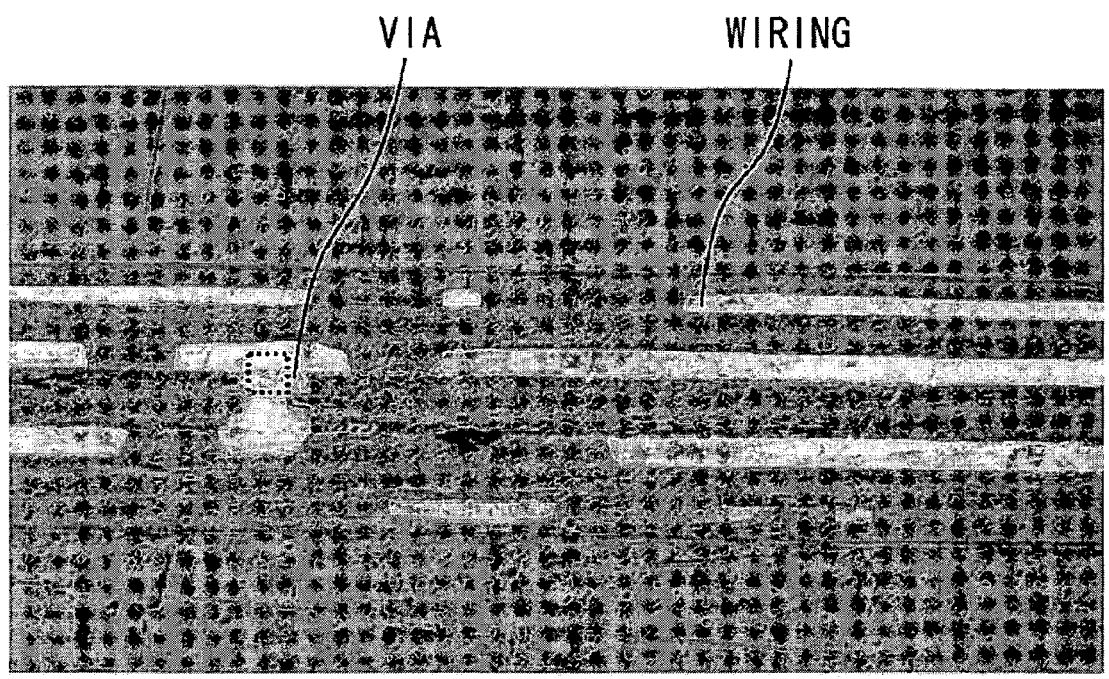
FIG. 4 is a section illustrating the via according to an example.

A via hole is formed as described in the above embodiment. The first metal film 110 (about 1 μm) is formed in the via hole by electroless plating. The metal oxide film 112 (about 1 nm) is formed by spraying the surface of the first metal film 110 with an oxygen gas at a high pressure (about 500 kPa). Further, the second metal film 114 (about 20 μm) is formed on the metal film 112 by electroless plating. With this, the via 116 is formed. FIG. 4 is a section illustrating the structure of the via thus formed.

Figure 5:
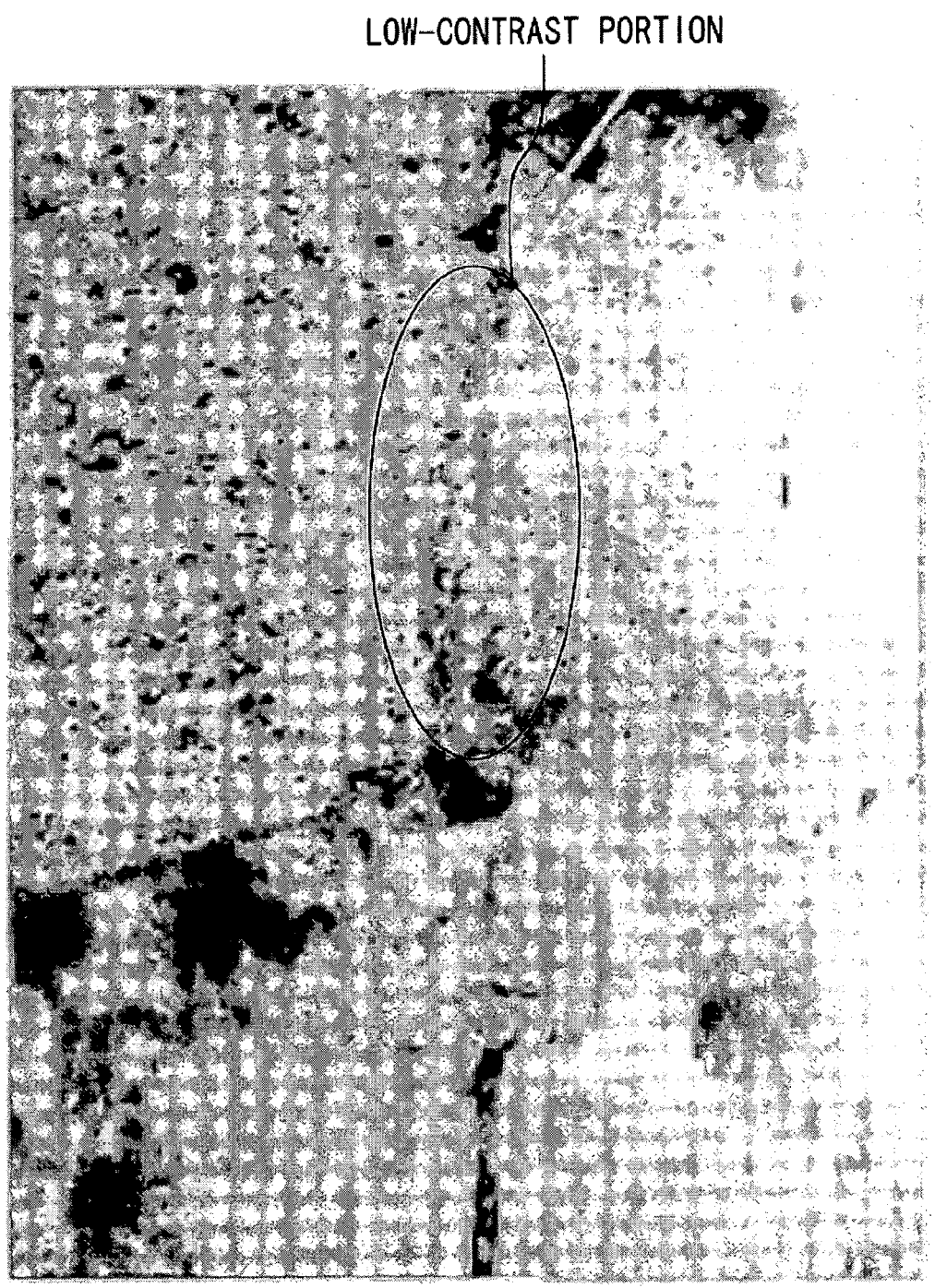
FIG. 5 is a transmission electron micrograph showing a magnified view of an encircled part of FIG. 4.

FIG. 5 is a transmission electron micrograph showing a magnified view of an encircled part of FIG. 4. A granular low-contrast portion is observed in the micrograph. The low-contrast portion is considered to be an amorphous oxide film. This demonstrates that the metal oxide film 112 is formed between the first metal film 110 and the second metal film 114 by spraying of an oxidizing gas.

Example 2

After forming the first metal film (about 1 μm) on the substrate by electroless plating, an oxygen gas is sprayed on the surface of the first metal film at a high pressure (about 500 kPa) so as to form a metal oxide film (about 1 nm). Further, a second metal film (about 20 μm) is formed on the metal oxide film by electroplating so that a sample is prepared. A sample, in which an oxygen gas is not sprayed and the second metal film is directly formed on the first metal film, is prepared for a comparative example.

FIG. 6 is chart showing results of measuring the peel strength at a plurality of points (measurement points 1-5), using the samples described above. As demonstrated in FIG. 6, the peel strength of the sample in which an oxygen gas is sprayed (indicated in the chart as "w/ oxide film") is improved in comparison with the sample in which an oxygen gas is not sprayed (indicated in the chart as "w/o oxide film").

The semiconductor apparatus 100 including the wiring substrate 101 described above may be applied to an integrated system in board TM (ISB) package described below. An ISB package is a coreless system in package, a type of electronic circuit packaging mainly comprising bare semiconductor chips, that has a copper wiring pattern but does not use a core (substrate) for supporting circuit components (see patent document No. 2).

An ISB package is produced by forming a stack of a plurality of layers of conductive patterns on a conductive foil that also functions as a supporting substrate, mounting circuit elements in a resultant multilayer wiring structure, molding the structure by an insulating resin, and removing the conductive foil. The conductive foil may have its underside exposed.

According to this package, the following advantages are available.

(i) Since the package is coreless, small-sized and low-profile transistors, ICs and LSIs can be fabricated.
(ii) Since transistors, system LSIs, and capacitors and resistors of a chip type can be built into the circuit for packaging, a highly advanced system in package (SIP) is achieved.
(iii) By employing a combination of currently available semiconductor chips, a system LSI can be developed in a short period of time.
(iv) Since there is no core material underneath the bare semiconductor chips, resultant heat dissipation is favorable.
(v) Since the circuit wiring is made of copper and not supported by any core material, a low-dielectric circuit wiring, exhibiting excellent characteristics in high-speed data transfer and high-frequency circuits, results.
(vi) Since electrodes are embedded inside the package, creation of particle contaminants derived from an electrode material is controlled.
(vii) The package size is free. Since the volume of discarded materials per one package is approximately 1/10 of a 64-pin SQFP package, the load placed on the environment is reduced.
(viii) A new system configuration, embodying a concept shift from a printed circuit board carrying components to a circuit board with built-in functions, is realized.
(ix) Designing an ISB pattern is as easy as pattern design of a printed circuit board so that engineers of a set manufacturer can design the pattern on their own.

Described above is an explanation of the present invention based on the embodiment and the example. The embodiment and the example are only illustrative in nature and it will be obvious to those skilled in the art that variations are possible within the scope of the present invention.

In the described embodiment, FIG. 1E illustrates the via hole 108 as being completely filled by the second metal film 114. Alternatively, the via hole 108 may not be filled by the second metal film 114.

While the via hole 108 is described as being formed by using laser or the like according to the embodiment, the insulating resin film 106 may be formed of a photosensitive material so that the via hole 108 is formed by irradiating the insulating resin film 106 with light using the second conductive film 104 as a mask and removing irradiated portions. The photosensitive material may be photosensitive polyimide resin, photosensitive epoxy resin, photo solder resist, polymethyl methacrylate (PMMA) or the like. PDF300 (from Nippon Steel Chemical Co., Ltd.) or AUS402 (from Taiyo Ink Mfg. Co. Ltd.) may be used as a photo solder resist.

While the via 116 according to the embodiment is described as being formed in the via hole 108 formed in the insulating film 106, the present invention is applicable in forming wiring or a via in an interlayer insulating film formed on a semiconductor substrate.

What is claimed is:

1. A wiring substrate comprising:
   a substrate; and
   wiring that fills a recess in the substrate, wherein
   the wiring comprises a first metal film that covers the side wall of the recess, a metal oxide film that covers the first metal film, and a second metal film on the metal oxide film.

2. The wiring substrate according to claim 1, wherein the first metal film and the second metal film are copper.

3. The wiring substrate according to claim 1, wherein the metal oxide film is an oxidized form of the first metal film.

4. The wiring substrate according to claim 2, wherein the metal oxide film is an oxidized form of the first metal film.

5. The wiring substrate according to claim 1, wherein the substrate is an insulating resin film.

6. The wiring substrate according to claim 2, wherein the substrate is an insulating resin film.

7. The wiring substrate according to claim 3, wherein the substrate is an insulating resin film.

8. The wiring substrate according to claim 4, wherein the substrate is an insulating resin film.

9. The wiring substrate of claim 2 wherein the metal oxide film has a thickness equal to or less than 10 nm.

10. The wiring substrate of claim 2 wherein the metal oxide film has a thickness equal to or less than 1 nm.

11. The wiring substrate of claim 10 wherein the metal oxide film has a thickness equal to or greater than 0.1 nm.

12. A method of fabricating a wiring substrate comprising the steps of:
   forming a recess in a substrate;
   forming a first metal film so as to cover the side wall of the recess;
   forming a metal oxide film on the first metal film by oxidizing the surface of the first metal film; and
   forming a second metal film on the metal oxide film.

13. The method of fabricating a wiring substrate according to claim 12, wherein the first metal film and the second metal film are formed of copper.

* * * * *